United States Patent [19]

Cho et al.

[11] Patent Number: 5,119,172
[45] Date of Patent: Jun. 2, 1992

[54] MICROELECTRONIC DEVICE PACKAGE EMPLOYING CAPACITIVELY COUPLED CONNECTIONS

[75] Inventors: Frederick Y. Cho, Scottsdale; Gerald Norley, Tempe; David Penunuri, Fountain Hills, all of Ariz.

[73] Assignee: Motorola, Inc., Schaumburg, Ill.

[21] Appl. No.: 663,347

[22] Filed: Mar. 4, 1991

[51] Int. Cl.⁵ ............................................ H01L 23/78
[52] U.S. Cl. ................................... 357/72; 357/65; 357/74; 357/84
[58] Field of Search .................. 357/74, 80, 65, 72, 357/84; 361/303, 302, 306, 311

[56] References Cited

U.S. PATENT DOCUMENTS

| | | | |
|---|---|---|---|
| 4,714,952 | 12/1987 | Takekawa et al. | 174/52.4 |
| 4,714,981 | 12/1987 | Gordon | 174/52.4 |
| 4,737,744 | 4/1988 | Hayward et al. | 361/303 |
| 4,782,310 | 11/1988 | Saburi et al. | 361/303 |
| 5,010,390 | 4/1991 | Tanaka | 357/80 |

OTHER PUBLICATIONS

An article entitled, "The Elastic Properties of Thin-Film Silicon Nitride" by T. S. Hickernell, F. M. Fliegel, and F. S. Hickenell, IEEE Ultrasonics Symposium, Honolulu, HI (Dec. 1990).
An article entitled, "SAW Programmable Matched Filter Signal Processor" by F. S. Hickernell, M. D. Adamo, R. V. De Long and J. G. Hinsdale, Motorola Inc. Government Electronic Division, Scottsdale, AZ, IEEE, 1980 Ultrasonics Symposium, pp. 104-108.
An article entitled, "SAW Properties of SiO₂/120° Y-X LiNbO₃ Structure Fabricated by Magnetron Sputtering Technique" by Kazuhiko Yamanouchi and Satoshi Hayama, IEEE Transactions on Sonics and Ultrasonics, vol. SU-31, No. 1, Jan. 1984, pp. 51-57.

*Primary Examiner*—James W. Davie
*Attorney, Agent, or Firm*—Frank J. Bogacz

[57] ABSTRACT

A microelectronic device including a passivation layer disposed on the top surface has disposed on a portion of its surface a bonding agent. The resulting structure is inverted and sealed to a package base, forming a hermetically sealed cavity. This protects the microelectronic device from the environment. External electrical connection to other electronic apparatus is effected by means of conductors disposed on the package base surface. Alternating current (AC) capacitive coupling contacts allow electrical coupling to the microelectronic device and prevent violation of the integrity of the passivation layer. This method realizes compact microelectronics device packages which can be mass produced from entire microelectronic device substrates.

9 Claims, 3 Drawing Sheets

MICROELECTRONIC DEVICE PACKAGE EMPLOYING CAPACITIVELY COUPLED CONNECTIONS

CROSS-REFERENCE TO RELATED APPLICATIONS

The present application is related to co-pending U.S. patent applications Ser. Nos. 577,181 and 650,117 which are assigned to the same assignee as the present invention.

BACKGROUND OF THE INVENTION

The present invention pertains to packaging and passivation of microelectronic devices and more particularly to a technique for alternating current (AC) coupling of radio-frequency input and output signals to microelectronic devices contained in surface-mountable packages.

SAW devices are a class of microelectronic component which can perform a variety of radio frequency signal processing and conditioning functions. SAW devices may be formed on piezoelectric substrate materials or on more general materials if means are provided for electro-acoustic energy conversion, which can be comprised of a thin-film overlay of a piezoelectric material, as described in "SAW programmable matched filter signal processor," by F. S. Hickernell et al. (1980 IEEE Utrason. Symp. Proc., pp. 104-108). SAW devices operate by transforming an electrical signal into an acoustic surface wave signal through the piezoelectric effect. The surface acoustic wave signal is allowed to propagate along some portion of the substrate surface. The resulting surface acoustic wave propagation properties of the substrate provide the desired SAW device function.

Accordingly, it is important in employing these devices to avoid unwanted modification of the sound propagation properties of the surface of the substrate material. These properties can be substantially degraded through contact with foreign materials, or by damage to the substrate surface. Intimate contact with viscous solids or fluids, such as liquids and to a lesser extent gasses, results in substantial attenuation of surface acoustic waves, thereby greatly reducing the amplitude of an acoustic wave propagating on the surface of the substrate material.

SAW device substrates typically exhibit a variation of the time delay of a SAW signal in propagating from one point on the substrate to another point on the substrate versus temperature. This quantity, known as the temperature coefficient of delay (TCD) can be measured and is a property of the orientation and the composition of the SAW substrate employed. The TCD is influenced by the properties of any layers of material disposed over the SAW substrate surface, as is discussed in "SAW properties of SiO$_2$ 128° Y-X LiNbO$_3$ structure fabricated by magnetron sputtering technique," K. Yamanouchi and S. Hayama (IEEE Trans. Son. Ultrason..., Vol. SU-31, No. 1, Jan. 1984, pp. 51-57).

The non-zero TCD of typical SAW substrate materials results in changes in the electrical delay from the input to the output of a SAW device versus temperature. This occurs due to both anisotropic expansion of the substrate with temperature and changes in the elastic constants of the substrate with temperature. The thermal expansion properties of the SAW substrate often must be closely matched to those of the material on which the SAW device is mounted, both to avoid mechanical deformation and breakage of the SAW device with temperature and to avoid complex changes in the electrical performance which may occur due to the stresses produced in the SAW device by changes in temperature. Similarly, the TCD of the substrate may limit the applications for which a particular SAW device is suited.

SAW devices typically include means for absorption of acoustic energy in regions where it is desired to prevent acoustic wave propagation. These are included to avoid distortion of the device response by acoustic waves which have been reflected by the edges of the SAW device substrate, or by other features of the SAW device. Such reflected acoustic waves can result in unwanted acoustic energy echoes. These acoustic absorbers often are viscous materials such as silicone-based room temperature vulcanizing rubbers which are applied to the device surface by hand labor.

One approach to preventing unwanted contact of fluids and other undesirable material to SAW device substrate surfaces is to place the SAW device in a hermetically sealed package. Electrical connections to the devices can then be made by means of wires bonded to the SAW device and to electrically conductive pins which effect electrical contact to external electronic circuits. This electrical contact is often realized through insertion of the portions of the pins which are external to the package into suitably prepared holes drilled through circuit boards and by then soldering the pins to the boards.

Such practices are not well suited to automated manufacturing of electronic products. This is due to bending of the pins in shipment and also during insertion of the pins into the circuit board. The bond wires employed to electrically connect the SAW device and the pins require an additional manufacturing operation and are susceptible to breakage during the service life of the finished component. Also, the bond wires and the SAW device bus bars or bonding pads often are required to be made of dissimilar metals. Contact between dissimilar metals is a well-known cause of interconnection failure in microelectronic devices due to the formation of intermetallic compounds.

These manufacturing methods also provide SAW device packages which have much greater volume than the SAW substrate material employed. The additional volume is required in order to accommodate the volume of the acoustic absorber material on the SAW substrate as well as the bond wires and pins.

Thus, it is desirable to have a SAW packaging method which provides a hermetically sealed environment for the SAW die, which allows external electrical connections to be made to the SAW die, which further provides the advantages of occupying as little volume as possible, enabling assembly of the packaged SAW components en masse in order to minimize manufacturing costs, and which allows the completed component to be used by automated circuit assembly machinery.

SUMMARY OF THE INVENTION

A package apparatus for encapsulation of a microelectronic device and allowing electrical interconnection of the microelectronic device to external circuitry is described. The package has a base substrate including contact electrodes and vias. Mounted on the base is a microelectronic device substrate including interconnection electrodes. A passivation layer is deposited on the microelectronic device substrate and as well over the interconnection electrodes. Alternating current couplings are established through the passivation layer to electrically connect the interconnection electrodes. A bonding agent is placed between the device substrate and the base substrate to provide mechanical connection of the microelectronic device substrate and the base substrate.

The above and other features and advantages of the present invention will be better understood from the following detailed description taken in conjunction with the accompanying drawings.

DESCRIPTION OF THE PREFERRED EMBODIMENT

Figure 1:
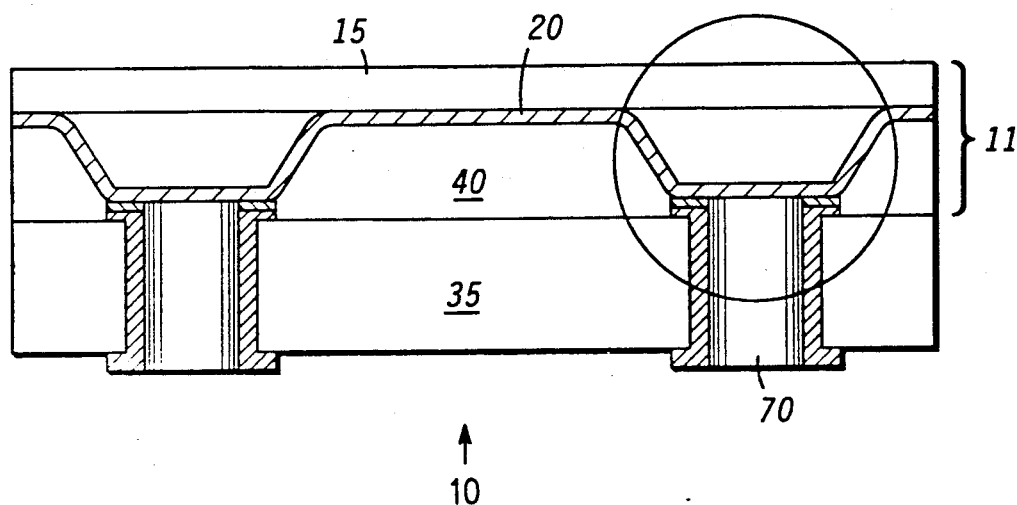
FIGS. 1 and 1A are cross-sectional and detailed cross-sectional views, respectively, of an assembled surface mountable SAW device package employing capacitively coupled connections between the SAW device and the package in accordance with the present invention.
Figure 1A:
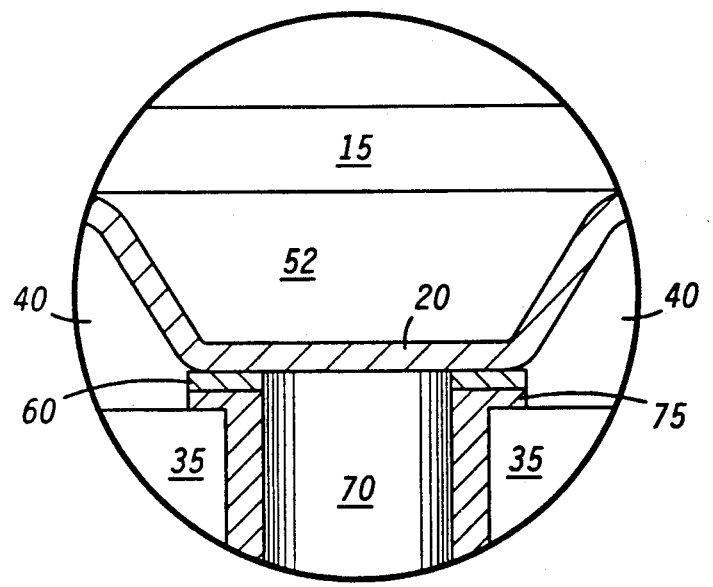

Referring to FIGS. 1 and 1A, cross sectional views are shown of a surface mountable package 10 employing capacitively coupled connections. The package 10 uses a surface acoustic wave (SAW) substrate 15 together with a passivating layer 20 disposed thereon to form the upper portion, or lid assembly 11, of the package 10. While the description of the preferred embodiment is given here in terms of packaging a SAW device 16, other types of microelectronic devices including other types of frequency selection components (of which a SAW device 16 is but one example) or, alternatively, semiconductor components might also benefit from the advantages of the present invention. The package lid assembly 11 is hermetically sealed to a package base 35 by means of a bonding agent 40. The rigid substrate 35 thus forms the lower portion, or base 35, of the package 10. Plan views of the lid assembly 11 and base 35 of the package 10 are shown in FIGS. 2 and 3, respectively.

Figure 2:
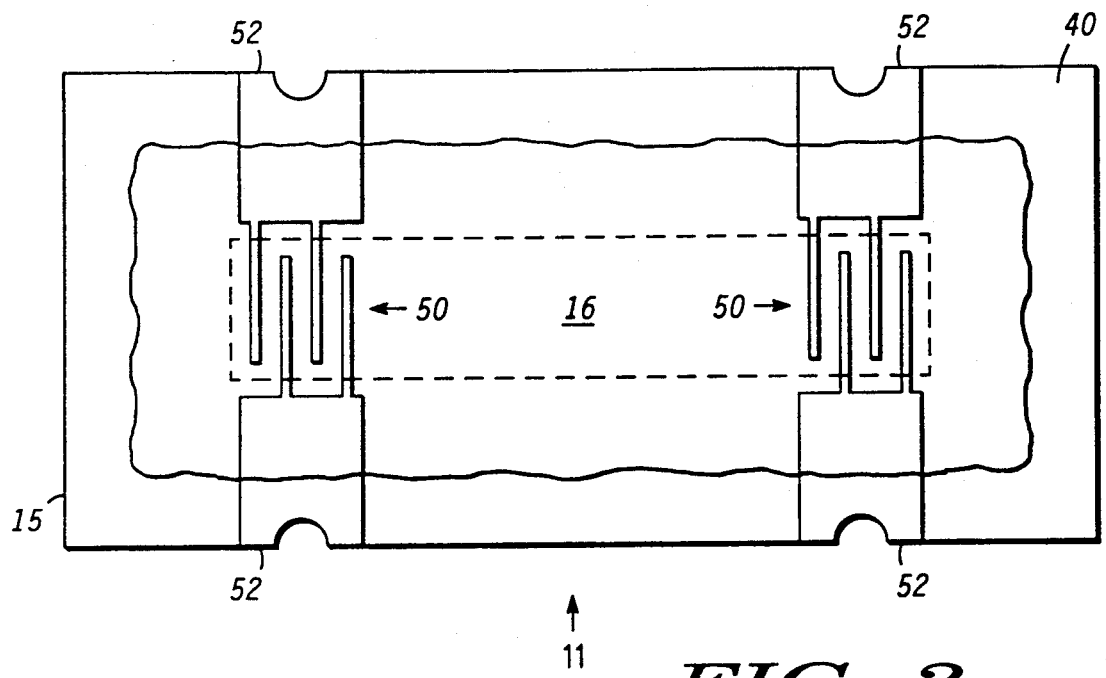
FIG. 2 is a bottom view of a SAW device on a substrate which forms the package lid of the surface mountable SAW device package in accordance with the present invention.
Figure 3:
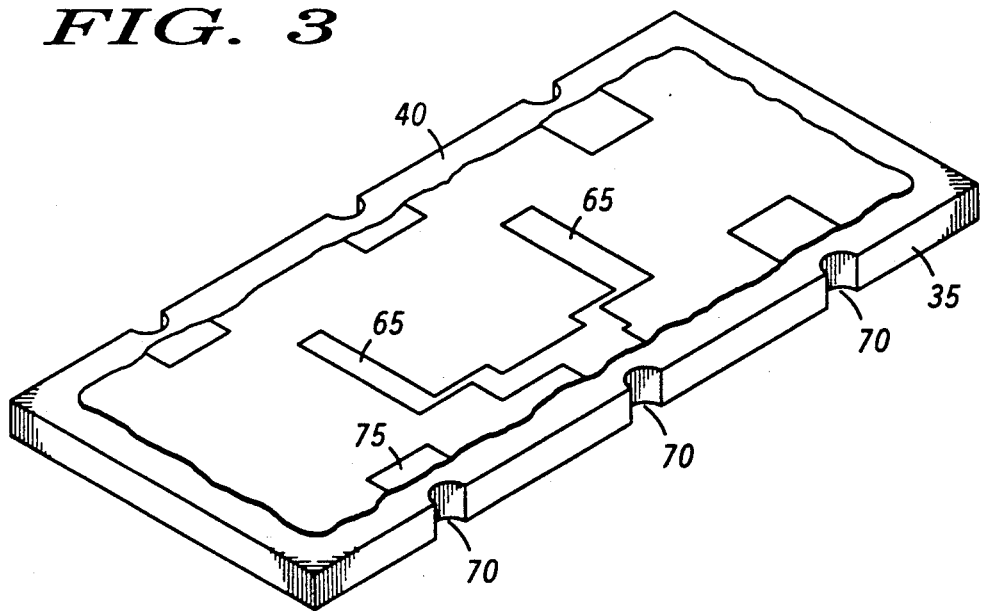
FIG. 3 provides a plan view of the bottom of an individual surface mountable SAW device package in accordance with the present invention.

In FIG. 2, the SAW device 16 is shown to be included on a piezoelectric substrate 15 which includes SAW transduction means shown as thin-film metallic interdigital SAW transducers 50. The SAW transducers 50 and the associated metallized bus bars 52 in FIG. 2 have disposed over them the passivation layer 20 as shown in FIG. 1, thus protecting the thin-film metallization, of which the transducers 50 are composed, from chemical attack and from damage such as scratching during SAW device 16, and package 10 and lid assembly 11 manufacturing and assembly. The passivation layer may be composed of plasma-enhanced chemical vapor deposited hydrogenated silicon nitride, the acoustic properties of which are discussed in "The Elastic Properties of Thin-Film Silicon Nitride," by T. S. Hickernell, F. M. Fliegel, and F. S. Hickernell, presented at the 1990 Inst. of Electr. and Electron. Eng. Ultrason. Symp., Honolulu, Hi., Dec. 1990 (to be published in the Proc. of the 1990 Ultrason. Symp.). Conductive interconnection pads 60 in FIG. 1A are disposed on the passivation layer 20 such that the interconnection pads 60 are capacitively coupled to the bus bars 52.

This arrangement permits radio-frequency electrical connection of the SAW transducers 50 to apparatus (not shown) external to the SAW device 16 without violation of the integrity of the passivation layer 20. This arrangement also enables the choice of different materials for the SAW transducer bus bars 52 and the interconnection pads 60 without the necessity for contact between dissimilar metals.

The passivation layer 20 (or layers) may be chosen to have a temperature coefficient of delay (TCD) of magnitude equal or nearly equal to, and opposite in sign from, that of the SAW substrate material 15 employed. When such layers are employed, the resultant composite structure exhibits a greatly reduced TCD and so provides a superior SAW device 16.

Referring to FIG. 3, the shielding structures 65 are formed of conductive material disposed on the package base 35. The shield structures 65 are connected to earth ground and function to prevent unwanted coupling of electrical energy within the SAW device 16 in FIG. 2.

The base material 35, depicted in FIGS. 1, 1A and 3, and the lid assembly 11, shown in FIGS. 1, 1A and 2, which includes the SAW device 16, illustrated in FIG. 2, which is comprised of substrate materials which can be chosen to be similar in temperature coefficient of expansion. This choice minimizes stresses in the SAW device 16, as shown in FIG. 2, the lid assembly 11, illustrated in FIGS. 1, 1A, and 2, and the package base 35, depicted in FIGS. 1, 1A and 3, and so reduces the probability of fracture of any of the lid assembly 11, the package base 35, or the SAW device 16, due to temperature induced stresses, and this also minimizes temperature induced modification of the electrical properties of the SAW device 16, allowing the packaged device 10 in FIG. 1 to be employed in a broader variety of applications.

Again referring to FIG. 2, the bonding agent 40 may also serve as an absorber of acoustic energy which functions by acting as a viscous solid and thus converting that coherent acoustic energy from the SAW transducers 50 which does not contribute to the desired SAW device 16 properties into phonons of random energy and propagation direction. Such acoustic absorbers are required to avoid distortion of the desired electrical response which could otherwise occur due to unwanted echoes of the acoustic energy.

Referring again to FIGS. 1 and 1A, the package 10 is assembled by placing the bonding agent 40 on selected areas of the SAW device 16, as illustrated in FIG. 2, or the package base 35 in FIG. 3, or both, by means of automatic dispensing techniques such as thick film silk screening. The package base 35 and lid assembly 11 are then forced together and bonded to each other by a suitable heat, chemical, optical, or other curing treatment of the bonding agent 40, depicted in FIGS. 1, 1A, 2, and 3.

Referring again to FIG. 2, connection of the interconnection pads 60 on the SAW device 16 to external electronic apparatus is effected through means, shown in FIG. 3, of conductive vias 70 through, and conductive contact pads 75 on. the package base 35. The contact pads 75 are pressed into contact with the interconnection pads 60. depicted in FIGS. 1. 1A, and 2. by that pressure employed to bond the package base 35 and lid assembly 11 to each other, as shown in FIGS. 1 and 1A.

Figure 4:
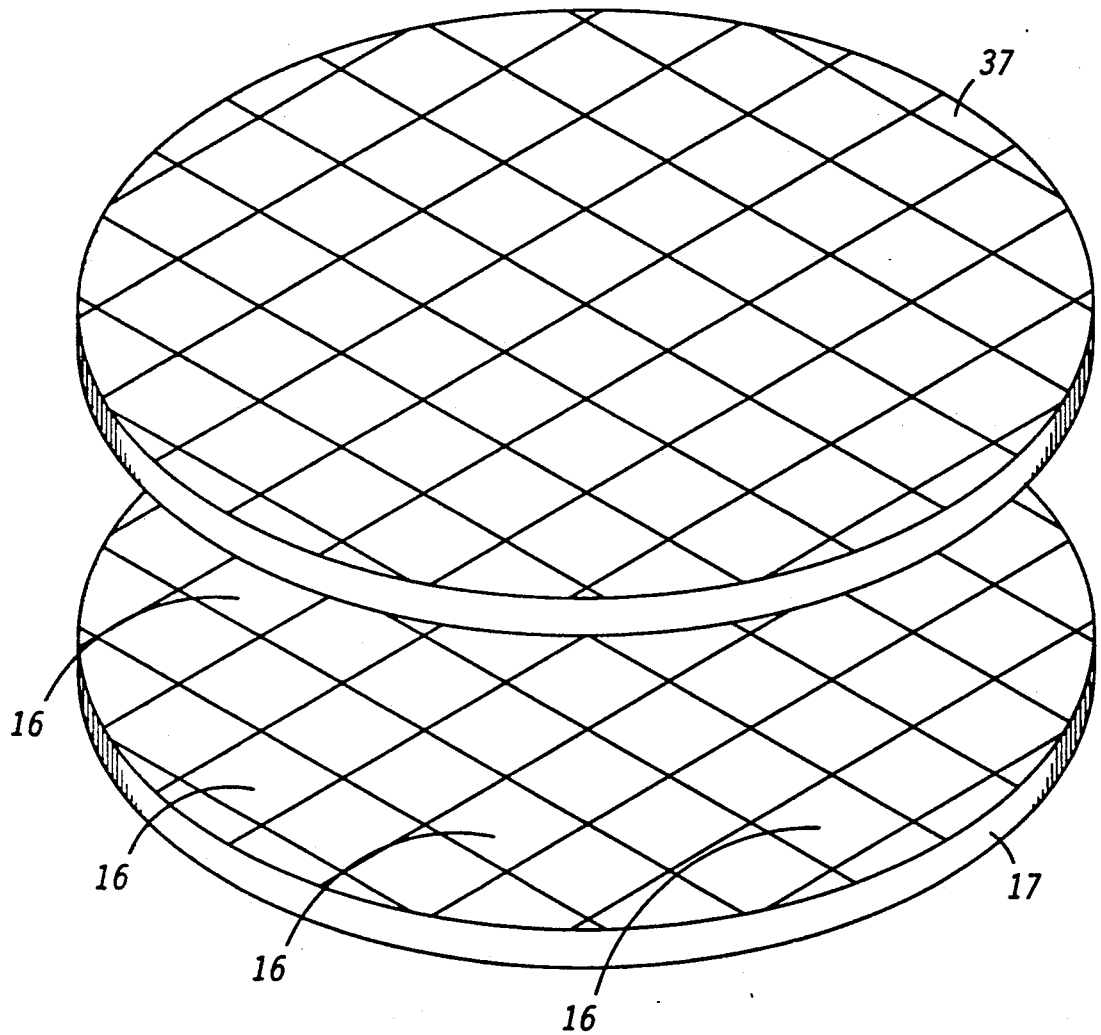
FIG. 4 depicts assembly of the top and bottom portions of surface mountable packages en masse in accordance with the present invention.

Referring to FIG. 4, the operations described above can be carried out prior to separation of the SAW device substrate material 17 and base substrate 37 to separate the individual package bases 35 and lid assemblies 11. as shown in FIG. 1. from one another. The separation may be effected through sawing, laser cutting, breaking along a predetermined direction defined by a weakened area in the material, such as the row of via holes 70, as shown in FIGS. 1, 1A, and 3, through the base package base 35, or other means which are well known in the art and so need not be discussed in greater detail here. Performance of these operations simultaneously on a group of such devices results in reduction of the manufacturing costs for the individual packaged devices. The reductions in cost stem both from the elimination of the steps of applying bond wires and of applying acoustic absorbing material in forming the individual devices 10 in FIG. 1. and also from the obviation of the step of applying and sealing a lid to the individual devices 10 by performing this latter step on entire arrays of microelectronic devices 17, as is illustrated in FIG. 4.

Referring again to FIGS. 1 and 1A, which depict one embodiment of the invention, the surface mountable SAW device package 10 includes microelectronic device substrate 15 which functions as the lid assembly 11 of the microelectronic device package 10. The microelectronic device substrate 15 in FIG. 2 may also include a SAW transducer 50. The SAW transducers 50 are coupled to the substrate 15 to produce surface acoustic waves. The apparatus further includes a passivation layer 20 which covers the substrate 15 including the SAW transducers 50 to a predetermined thickness. An AC coupling structure 60 is provided on the passivation layer 20 and over portions of the electrode structure comprising the SAW transducer 50. This provides for AC coupling of signals to the electrode structures 52 of the SAW transducer 50.

Referring again to FIG. 1, the surface mountable SAW package 10 also includes a rigid package base 35, illustrated in FIGS. 1, 1A and 3, with conductor patterns 75, as shown in FIGS. 1A and 3, disposed on the package base 35. These conductor patterns 75 contact the AC coupling structure 60 on the SAW device 16, as shown in FIG. 2, enabling external electronic apparatus, such as various types of radio frequency communications devices, to be electrically coupled to the SAW transducer 50. A bonding material 40 is disposed between the SAW substrate 15 and the package base 35 such that it surrounds the SAW propagation region 16 on the SAW substrate 15, mechanically coupling the SAW substrate 15 to the package base 35, as depicted in FIG. 1. This provides for hermetic sealing of the SAW propagation region 16, as shown in FIG. 2, on the SAW substrate 15 from contaminants. This bonding material 40 may also provide for attenuation of unwanted SAW energy where desired.

Referring again to FIG. 1, the surface-mountable SAW device package 10 greatly reduces the number of operations needed in order to assemble the device 16 in FIG. 2 on the lid assembly 11 and package 10, thereby reducing manufacturing costs. Use of such a package 10 also greatly reduces the size and weight of the packaged SAW device 10, providing reduced size and weight to electronic apparatus employing SAW devices and so enabling greater functional density for such electronic products (not shown). The package 10 prevents contamination of the SAW device substrate 15 surface by foreign substances which would deleteriously affect the desired acoustic propagation properties, and effects necessary external electrical contacts through capacitive means 60 to the SAW device substrate 15.

Accordingly, the advantage of the present invention mentioned above, to provide microelectronic device packages 10 of greatly reduced size, weight, and manufacturing costs, which are compatible with automated circuit assembly techniques, is achieved. A further advantage achieved by the present invention is to provide a method for manufacturing such microelectronic device packages 10.

In accomplishing the advantages of the present invention, a novel surface mountable SAW device package 10 employing capacitively coupled connections 60 used with a method for manufacturing such packages 10 for microelectronic devices has been shown.

Although the preferred embodiment of the invention has been illustrated, and that form described in detail, it will be readily apparent to those skilled in the art that various modifications may be made therein without departing from the spirit of the invention or from the scope of the appended claims.

We claim:

1. Package apparatus for microelectronic device encapsulation and for allowing electrical interconnection of the encapsulated microelectronic device to external circuitry, said package apparatus comprising:
    a base substrate including contact electrodes and vias;
    a microelectronic device substrate including interconnection electrodes disposed on said microelectronic device substrate;
    means for passivation disposed on said base substrate and disposed over said interconnection electrode;
    means for alternating current coupling disposed on said passivation means and disposed over said interconnection electrodes;
    means for bonding disposed between said microelectronic device substrate and said base substrate, said bonding means providing for mechanical connection of said microelectronic device substrate to said base substrate.

2. Package apparatus for microelectronic device encapsulation as claimed in claim 1, wherein said passivation means includes a dielectric layer.

3. Package apparatus for microelectronic device encapsulation as claimed in claim 1, wherein said microelectronic device includes semiconductor device.

4. Package apparatus for microelectronic device encapsulation as claimed in claim 1, wherein said microelectronic device includes surface acoustic wave device.

5. Package apparatus for microelectronic device encapsulation as claimed in claim 4, wherein said passivation means includes means for providing surface acoustic wave device temperature compensation.

6. Package apparatus for microelectronic device encapsulation as claimed in claim 4, wherein said microelectronic device substrate means includes a thin-film piezoelectric overlay disposed on the surface of the microelectronic device substrate.

7. Package apparatus for achieving microelectronic device encapsulation means as claimed in claim 4, wherein said bonding means also provides for damping of surface acoustic wave propagation on said surface acoustic wave substrate means.

8. Package apparatus for microelectronic device encapsulation as claimed in claim 4, wherein said base substrate provides for temperature coefficient of expansion match to said surface acoustic wave device.

9. Package apparatus for microelectronic device encapsulation as claimed in claim 4, wherein said base substrate provides for electric shielding means of electrodes.

* * * * *